United States Patent [19]

Fukuda

[11] Patent Number: 5,424,687
[45] Date of Patent: Jun. 13, 1995

[54] PLL FREQUENCY SYNTHESIZER AND PLL FREQUENCY SYNTHESIZING METHOD CAPABLE OF OBTAINING HIGH-SPEED LOCK-UP AND HIGHLY-RELIABLE OSCILLATION

[75] Inventor: Shinri Fukuda, Tokyo, Japan
[73] Assignee: NEC Corporation, Tokyo, Japan
[21] Appl. No.: 293,447
[22] Filed: Aug. 19, 1994

[30] Foreign Application Priority Data

Aug. 23, 1993 [JP] Japan ................... 5-229450

[51] Int. Cl.$^6$ ................. H03L 7/087; H03L 7/10; H03L 7/18
[52] U.S. Cl. .................... 331/11; 331/14; 331/16; 331/17; 331/18; 331/25; 331/DIG. 2; 455/260
[58] Field of Search ................. 331/10, 11, 14, 16, 331/17, 18, 25, DIG. 2; 375/120; 455/260

[56] References Cited

U.S. PATENT DOCUMENTS

| | | | |
|---|---|---|---|
| 4,069,462 | 1/1978 | Dunn | 331/11 |
| 4,365,211 | 12/1982 | Lee | 331/11 |
| 4,459,560 | 7/1984 | Kurihara | 331/11 X |
| 4,511,859 | 4/1985 | Dombrowski | 331/11 |
| 4,542,351 | 9/1985 | Okada | 331/11 |
| 4,598,257 | 7/1986 | Southard | 331/14 X |
| 4,940,952 | 7/1990 | Kegasa | 331/14 X |
| 4,943,788 | 7/1990 | Laws et al. | 331/DIG. 2 X |
| 5,315,269 | 5/1994 | Fujii | 331/11 X |
| 5,371,480 | 12/1994 | Hedberg et al. | 331/16 |

FOREIGN PATENT DOCUMENTS 2-94710   4/1990   Japan .
3-38921   2/1991   Japan .

*Primary Examiner*—David Mis
*Attorney, Agent, or Firm*—Foley & Lardner

[57] ABSTRACT

According to an output from a voltage-controlled oscillator, there are generated by a fractional divider a high-frequency division signal and a low-frequency division number. A phase comparison is conducted between the high-frequency division signal and a high-frequency reference signal by a phase comparator. A phase comparison is carried out between the low-frequency division signal and a low-frequency reference signal by a phase comparator. Either one of the outputs from the phase comparators is selected by a selector to be fed to a filter, thereby producing a control voltage for the voltage-controlled oscillator. A high-resolution division is achieved by the fractional division; consequently, disturbance of the oscillation frequency due to a change-over of the selector is suppressed. There is obtained a PLL frequency synthesizer developing a high-speed lock-up and a highly stable oscillation.

9 Claims, 5 Drawing Sheets

F I G. 5
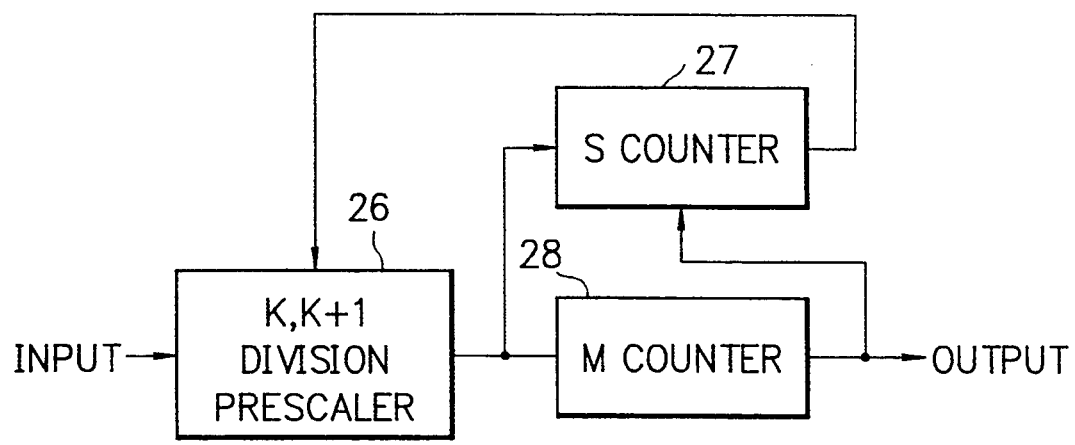
DIVIDING NUMBER A = K · M + S

PLL FREQUENCY SYNTHESIZER AND PLL FREQUENCY SYNTHESIZING METHOD CAPABLE OF OBTAINING HIGH-SPEED LOCK-UP AND HIGHLY-RELIABLE OSCILLATION

BACKGROUND OF THE INVENTION

The present invention relates to a phase-locked loop (PLL) frequency synthesizer and a PLL frequency synthesizing method, and in particular, to a PLL frequency synthesizer and a PLL frequency synthesizing method capable of obtaining a high-speed lock-up and a highly-reliable oscillation.

DESCRIPTION OF THE RELATED ART

Heretofore, a minimized lock-up time and a highly stable oscillation have been desired as characteristics of the PLL frequency synthesizer. The lock-up time minimization means reduction of a period of time required to develop a reference frequency, whereas the highly stable oscillation indicates strength against external disturbances. As well known, a high-speed characteristic of the lock-up time is attained when controlled by a higher comparison frequency. On the other hand, the oscillation is stabilized much easier when controlled by a lower comparison frequency.

For an efficient use of these conflicting advantageous features, there have been known PLL frequency synthesizers utilizing a reference frequency and comparison frequencies obtained through divisions by a larger divisor and a smaller divisor (reference is to be made, e.g., to the Japanese Patent Laid-Open Publication No. 2-94710 and Japanese Patent Laid-Open Publication No. 3-38921). According to the conventional technologies, a phase-locked loop is configured by a reference frequency and comparison frequencies obtained through divisions by a larger divisor and a smaller divisor. That is, a higher comparison frequency and an ordinary comparison frequency are used according to the magnitude of the difference between a target frequency and a current oscillation frequency. Specifically, for a large difference therebetween, a phase comparison is conducted in a state of a high frequency obtained by division by a small divisor so as to increase the speed of convergence onto the target frequency. After the oscillation frequency is thus led to a value near the target frequency in this state, when the frequency discrepancy is resultantly minimized, there is accomplished a phase comparison in a state of a lower comparison frequency obtained through division by a large divisor, namely, with the ordinary comparison frequency, thereby obtaining the target frequency with a high reliability.

However, when the comparison frequency is increased as described above, the setting frequency only reaches a value near the target frequency. As shown in the lock-up characteristic of FIG. 1, deviation $\Delta f$ takes place for the setting frequency at a first convergence terminal point t1. Although there exists the deviation $\Delta f$, it is necessary to change the comparison frequency to the ordinary comparison frequency at a point of time t2 to attain the correct frequency. In the frequency change, there occurs distortion in the waveform and hence it is necessary to take a period of lock-up time (t2 to t3) for convergence of the frequency. This namely leads to a problem of disadvantage for the high-speed lock-up.

SUMMARY OF THE INVENTION

It is therefore an object of the present invention to provide a PLL frequency synthesizer capable of attaining a high-speed lock-up and a highly reliable oscillation.

In accordance with the present invention, there is provided a PLL frequency synthesizer in which a phase comparison is conducted between a reference signal and an oscillation signal to control a phase of the oscillation signal so as to produce an oscillation signal related to the reference signal. The synthesizer includes reference signal dividing means for generating a first reference signal by dividing the reference signal and for generating a second reference signal by dividing the first reference signal by a predetermined division number, fractional dividing means for dividing the oscillation frequency of the oscillation signal by a fractional division number and thereby producing a first division signal having a frequency substantially equal to that of the first reference signal and for producing a second division signal by dividing the first division signal by the predetermined division number, first comparing means for comparing the first reference signal with the first division signal and thereby producing a first comparison signal, second comparing means for comparing the second reference signal with the second division signal and thereby producing a second comparison signal, and selecting means for selecting according to a state of the first comparison signal either one of the first and second comparison signals, thereby controlling the phase of the oscillation signal according to the comparison signal created from the selecting means.

In addition, the PLL frequency synthesizer further includes phase lock sensing means. The phase lock sensing means senses substantial presence and absence of the first comparison signal and outputs a sense signal thereof to the selecting means. The selecting means favorable selects the first or second comparison signal respectively when the first or second comparison signal is present and thereby outputting the selected signal.

Furthermore, the PLL frequency synthesizer further includes a filter which smoothes the comparison signal produced from the selecting means.

Moreover, the comparing and (fractional) dividing means includes A count means for dividing the oscillation signal by A, (A+1) count means for dividing the oscillation signal by (A+1), F count means for counting cycles of a repetitious count operation in M cycles, and M count means for counting repetitions (A, F, and M are integers). The fractional division number N is desirably obtained through count operations of the respective count means according to a relational expression $$N = A \cdot (M - F) + (A + 1) \cdot F$$

where, A and F are respectively a quotient and a remainder obtained by dividing N by M.

In addition, the A count means includes dual modulus count means for achieving a change-over between a K division and a K+1 division, S count means for conducting an S count operation, and second M count means (K, S, and M are integers). The A division is favorably obtained through count operations of the respective count means according to a relational expression $$A = K \cdot (M-S) + (K+1) \cdot S.$$

In accordance with the present invention, there is provided a PLL frequency synthesizing method in which a phase comparison is conducted between a reference signal and an oscillation signal to control a phase of the oscillation signal so as to produce an oscillation signal related to the reference signal. The method includes a reference signal dividing step of generating a first reference signal by dividing the reference signal and for generating a second reference signal by dividing the first reference signal by a predetermined division number, a fractional dividing step of dividing the oscillation frequency of the oscillation signal by a fractional division number and thereby producing a first division signal having a frequency substantially equal to that of the first reference signal and for producing a second division signal by dividing the first division signal by the predetermined division number, a first comparing step of comparing the first reference signal with the first division signal and thereby producing a first comparison signal, a second comparing step of comparing the second reference signal with the second division signal and thereby producing a second comparison signal, and, a selecting step of selecting according to a state of the first comparison signal either one of the first and second comparison signals, thereby controlling the phase of the oscillation signal according to the comparison signal created from the selecting means.

Furthermore, the PLL frequency synthesizing method further includes a phase lock sensing step. The phase lock sensing step senses substantial presence and absence of the first comparison signal and outputs a sense signal thereof to the selecting step. The selecting step desirably selects the first or second comparison signal respectively when the first or second comparison signal is present and thereby outputs the selected signal.

In addition, the fractional dividing step includes an A count step for dividing the oscillation signal by A, an (A+1) count step for dividing the oscillation signal by (A+1), an F count step for counting cycles of a repetitious count operation in M cycles, and an M count step for counting repetitions (A, F, and M are integers). The fractional division number N is favorably obtained through count operations of the respective count steps according to a relational expression $$N = A \cdot (M-F) + (A+1) \cdot F$$

where, A and F are a quotient and a remainder attained by dividing N by M.

Moreover, the A count step includes a dual modulus count step of achieving a change-over operation between a K division and a K+1 division, an S count step of conducting an S count operation, and a second M count step (K, S, and M are integers). The A division is desirably obtained through count operations of the respective count steps according to a relational expression $$A = K \cdot (M-S) + (K+1) \cdot S.$$

In consequence, according to the primary portions of the PLL frequency synthesizer and the PLL frequency synthesizing method in accordance with the present invention, the reference signal is divided to obtain a first reference signal and then the first reference signal is again divided to attain a second reference signal. A phase comparison is conducted between each of the first and second reference signal and the oscillation signal to obtain first and second comparison signals. Controlling the phase of the oscillation signal based thereon, there is generated an oscillation signal associated with the reference signal. For this purpose, in the PLL frequency synthesizer in accordance with the present invention, the oscillation frequency of the oscillation signal is divided by a fractional divisor to produce a first division signal having a frequency equal to that of the first reference signal. Moreover, the first division signal is further divided by a predetermined divisor to attain a second division signal. Depending on a result of the comparison between the first division signal and the first reference signal, either one of the first and second comparison signals is selected as an output signal, thereby controlling the phase of the oscillation signal according to the output signal.

Consequently, the phase of the oscillation frequency is controlled in a first stage according to the first high-frequency division signal obtained through division by the fractional divisor. In the first stage, when the phase difference between the oscillation signal and the first reference signal becomes substantially zero, a comparative control is achieved with the second reference signal using the second low-frequency division signal in a second stage. Since the first division signal used in the first-stage control is obtained by a fractional divisor, there is almost no frequency discrepancy relative to the reference signal. The control operation is effected with the division signal substantially not having the frequency discrepancy with respect to the reference signal, it is possible to accomplish a highly accurate control in the first stage.

BRIEF DESCRIPTION OF THE DRAWINGS

The objects and features of the present invention will become more apparent from the consideration of the following detailed description taken in conjunction with the accompanying drawing wherein:

FIG. 5 is a circuit block diagram showing a general pulse swallow divider applicable to the second embodiment.

DESCRIPTION OF THE PREFERRED EMBODIMENTS

Referring now to the accompanying diagrams, description will be given in detail of embodiments of the PLL frequency synthesizer and the PLL frequency synthesizing method in accordance with the present invention. FIGS. 2 to 5 show embodiments of the PLL synthesizer and the synthesizing method in accordance with the present invention.

Figure 2:
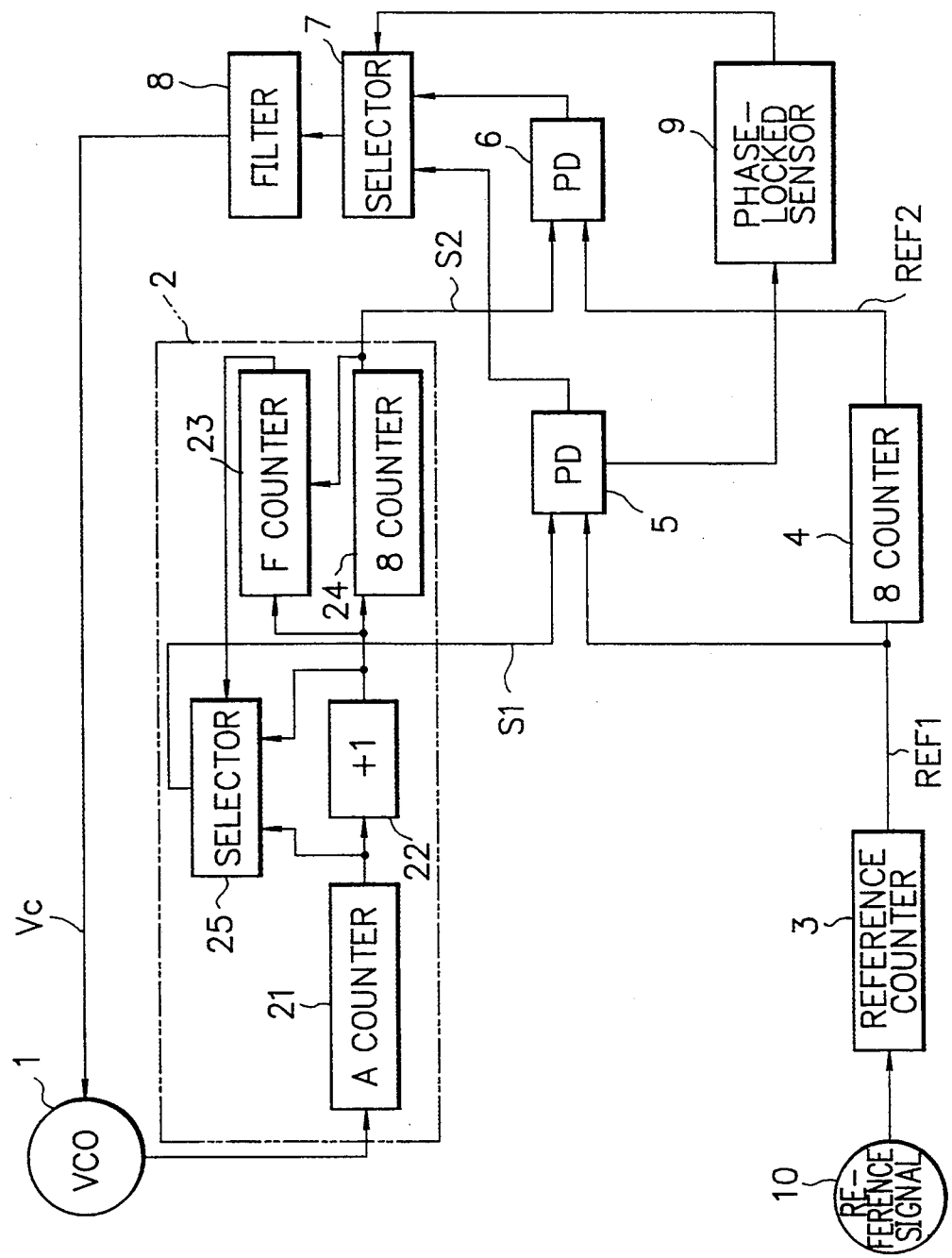
FIG. 2 is a schematic circuit block diagram showing a first embodiment of the PLL frequency synthesizer in accordance with the present invention.
Figure 3:
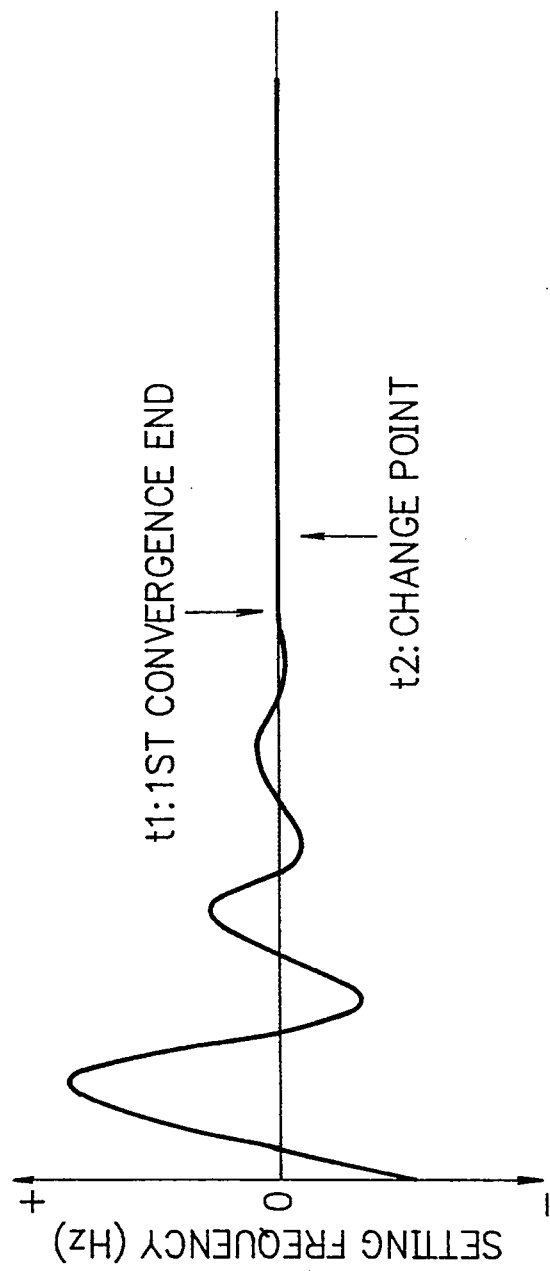
FIG. 3 is a graph showing timings of the lock-up characteristic of the first embodiment.

FIG. 2 shows in a circuit block diagram a first embodiment of the PLL frequency synthesizer in accordance with the present invention. FIG. 8 is a timing diagram presenting the lock-up characteristic of the synthesizer. The synthesizer includes a voltage-controlled oscillator (to be simply abbreviated as VCO) 1, a fractional divider 2 to divide a frequency signal oscillated from the VCO 1, and a control circuit section to control the oscillation frequency of the VCO 1. The control section includes a reference signal oscillator 10, a reference counter 3, and 8 counter 4, phase comparators 5 and 6, a selector 7, a filter 8, and a phase-locked sensor 9.

The VOC 1 receives a control voltage Vc to create a signal having a frequency corresponding to the voltage Vc. The output signal is fed to the fractional divider 2. In the divider 2, a high-frequency division signal S1 and a low-frequency division signal S2 are produced from the received signal.

On the other hand, the reference signal oscillator 1 constituting the control circuit controlling the oscillation frequency of the VOC 1 is a reference signal oscillator including, for example, a crystal oscillator. The reference counter 3 divides the reference signal to generate a first reference signal REF1 having a high frequency. The 8 counter (i.e., ⅛ divider) 4 divides by eight the first reference signal REF1 outputted from the reference counter 3 to obtain a second reference signal REF2 having a low frequency.

The phase comparator 5 achieves a phase comparison between the division signal S1 having a high frequency and the first reference signal REF1 having a high frequency. The phase comparator 6 compares a phase of the division signal S2 having a low frequency with that of the second reference signal REF2 having a low frequency. Signals delivered respectively from the comparators 5 and 6 are sent to the selector 7 such that either one thereof is fed to the filter 8 to be smoothed. The smoothed voltage is obtained as a control voltage Vc for the voltage-controlled oscillator 1. In this case, the outputs from the phase comparators 5 and 6 are subjected to selection by the selector 7, which is controlled by the phase-locked sensor 9. That is, in a state where a phase difference exists between the division signal S1 and the first reference signal, namely, the comparison result to be outputted from the phase comparator 5 is substantially existing, the sensor 9 enables the selector 7 to choose the phase comparator 5. This means that the oscillation frequency is controlled by the division signal S1.

Conversely, in a state where the phase difference is substantially missing between the division signal S1 and the first reference signal, namely, the output signal of the comparison result from the phase comparator 5 is substantially absent, the phase-locked sensor 9 causes the selector 7 to choose the phase comparator 6. This means that the oscillation frequency is controlled by the division signal S2.

Incidentally, when the selector 7 selects either one of the phase selectors 5 and 6, the remaining comparator not selected is set to a high-impedance output state.

The fractional divider 2 of the PLL frequency synthesizer configured as above includes an A counter 21, a +1 counter 22, an F counter 23, an 8 counter 24, and a selector 25.

The fractional divider 2 is a divider to accomplish a so-called fractional division. For a specific explanation of operation thereof, assume that the resolution of the division frequency is set to ⅛, namely, the frequency of the high division signal S1 is set to be 8 times that of the low division signal S2 and the frequency of the high-frequency first reference signal REF1 is set to be 8 times that of the low-frequency second reference signal REF2.

The A counter 21 receives the output signal from the VCO 1 to divide the signal by A. The +1 counter 22 is a counter which increments by one the output signal from the VCO 1 to create a signal of an (A+1) counter. The F counter 23 and the 8 counter 24 are counters conducting divisions respectively by F and 8. The selector 25 is a selector which selects either one of the output signals from the A counter 21 and the +1 counter 22 to output the selected signal therefrom. The selecting operation of the selector 25 is supervised by the output signal from the F counter 23.

In the operation of the fractional divider 2, the output from the oscillator 1 is delivered to the A counter 21. The output from the A counter is fed via the +1 counter 22 to the F counter 23 and the 8 counter 24. The outputs from the A counter 21 and the +1 counter 22 are inputted to the selector 25. The selecting operation of the selector 25 is controlled by the output from the F counter 23. As a result, the selector 25 selects either one of the signals outputted from the A counter 21 and the +1 counter 22 to output the selected signal therefrom.

In the configuration, the +1 counter 22 counts the pulses of which the number is larger by one (pulse) than the setting value of the A counter 21. The F counter 23 and the 8 counter 24 count the outputs from the +1 counter. The F counter 23 is reset by the output from the 8 counter 24. Resultantly, the selector 25 selects the output from the +1 counter 22, namely, the (A+1) division signal only during the F count period of the eight count period and selects the output from the A counter 21, namely, the A division signal during the remaining (8−F) count period, thereby outputting the selected signals.

Subsequently, description will be given of a concrete example of the fractional division. In a case where the PLL reference frequency of the oscillator 10 is 1 kHz and the oscillation frequency of the VCO 1 is 85 kHz, the dividing number N of the fractional divider 2 is 85. In this case, when the PLL reference frequency is altered to 8 kHz, namely, is multiplied by eight. The dividing number N becomes 10.625 for which division cannot be achieved by an ordinary divider. However, in the fractional divider 2 of the embodiment, the dividing number can be controlled to obtain a mean dividing number of 10.625 so as to conduct the desired operation. In other words, three divisions by ten and five divisions by 11 are achieved eight times as one cycle to develop a mean division value of 10.625. Similarly, to obtain an oscillation frequency of 86 kHz, it is only necessary to conduct two divisions by ten and six divisions by 11 so as to attain a mean value of 10.75.

Assuming that the quotient and remainder obtained by dividing the division number N by eight are respectively A and F, the relationship above is expressed as follows.

$$\begin{aligned} N &= A \cdot 8 + F \\ &= A \cdot 8 - A \cdot F + A \cdot F + F \\ &= A \cdot (8 - F) + (A + 1) \cdot F \end{aligned} \quad (1)$$

According to the expression (1), when an A division and an (A+1) division are, executed respectively (8−F) times and F times, there is attained a mean division. In binary notation, a mean division number of 85 is represented as "1010101". Since the division number N is eight (representable by three bits), the binary representation is partitioned in the three-bit unit to obtain 10 on the high-order bit side and 5 on the low-order bit side. Namely, the quotient and remainder are 10 and 5, which corresponds to 8×10+5.

The relationship is achieved in the circuit configuration of the fractional divider 2 of FIG. 2 as follows. The A counter counts the quotient, namely, the value A. Similarly, the +1 counter 22 and the F counter 23 respectively count (A+1) and the remainder F. The 8 counter 24 conducts multiplication by eight and the selector 25 selects either one of coefficients of A and (A+1). In consequence, according to operation of the F counter 23 and the 8 counter 24, the selector 25 selects the (A+1) division until the F count operation is finished. When the operation is completed, the A division is selected. After the 8 count operation is completely achieved by the 8 counter 24, the F counter 28 is reset to start the F count operation so as to again initiate the operation above. Outputs from the selectors 25 and the 8 counter 24 become the comparison frequency signals S1 and S2 respectively having a higher frequency and a lower frequency.

Thanks to adoption of the fractional division, a high-resolution division (by a value represented with a decimal point). Moreover, for the division setting data, binary data need only be set to the A counter 21 and the F counter 23, and there can be employed an algorithm which is substantially identical to that of the conventional technology.

As described above, the PLL frequency synthesizer of the first embodiment includes a signal having a relatively high comparison frequency and a signal having an ordinary comparison frequency. Initially, in the first stage, the division signal S1 having a high frequency and a first reference frequency signal REF1 having a high frequency are used to conduct a PLL operation by the phase comparator 5 so as to achieve a high-speed lock-up. Subsequently, after the frequency control operation is finished in the first stage, the division signal S2 having a low frequency and the second reference frequency signal REF2 having a low frequency are employed to carry out a PLL operation by the phase comparator 6. Through the control operation in the second stage, there is guaranteed a highly stable lock state.

Figure 1:
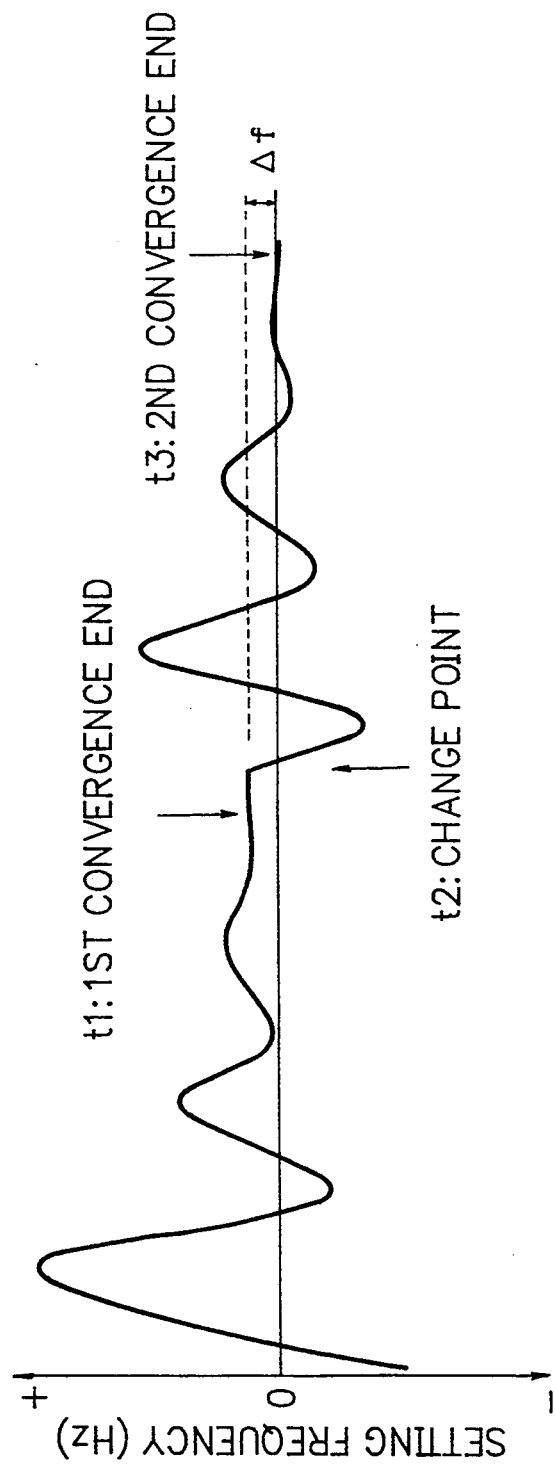
FIG. 1 is a graph showing timings related to the conventional lock-up characteristic.

In the conventional cases, when the PLL operation is effected in a high-frequency state, only the oscillation frequency approaches the target value, namely, there exists deviation (reference is to be made to t2 of FIG. 1) with respect to the reference frequency. However, according to the embodiment, thanks to the fractional division, the oscillation frequency is substantially equal to the target frequency. In other words, as can be seen from the lock-up characteristic of FIG. 3, even when the comparison frequency is high, a high-resolution division is accomplished. Consequently, at a convergence terminal or end point t1 in the first stage, the oscillation frequency of the oscillator 1 can be substantially set to the first reference frequency as the target value. Accordingly, the re-convergence at the change point t2 becomes unnecessary, namely, the lock-up state at the convergence in the first stage is continuously coupled with convergence in the second stage. That is, variation in the frequency at time t2 is almost suppressed and hence a high-speed lock-up is resultantly attained.

Figure 4:
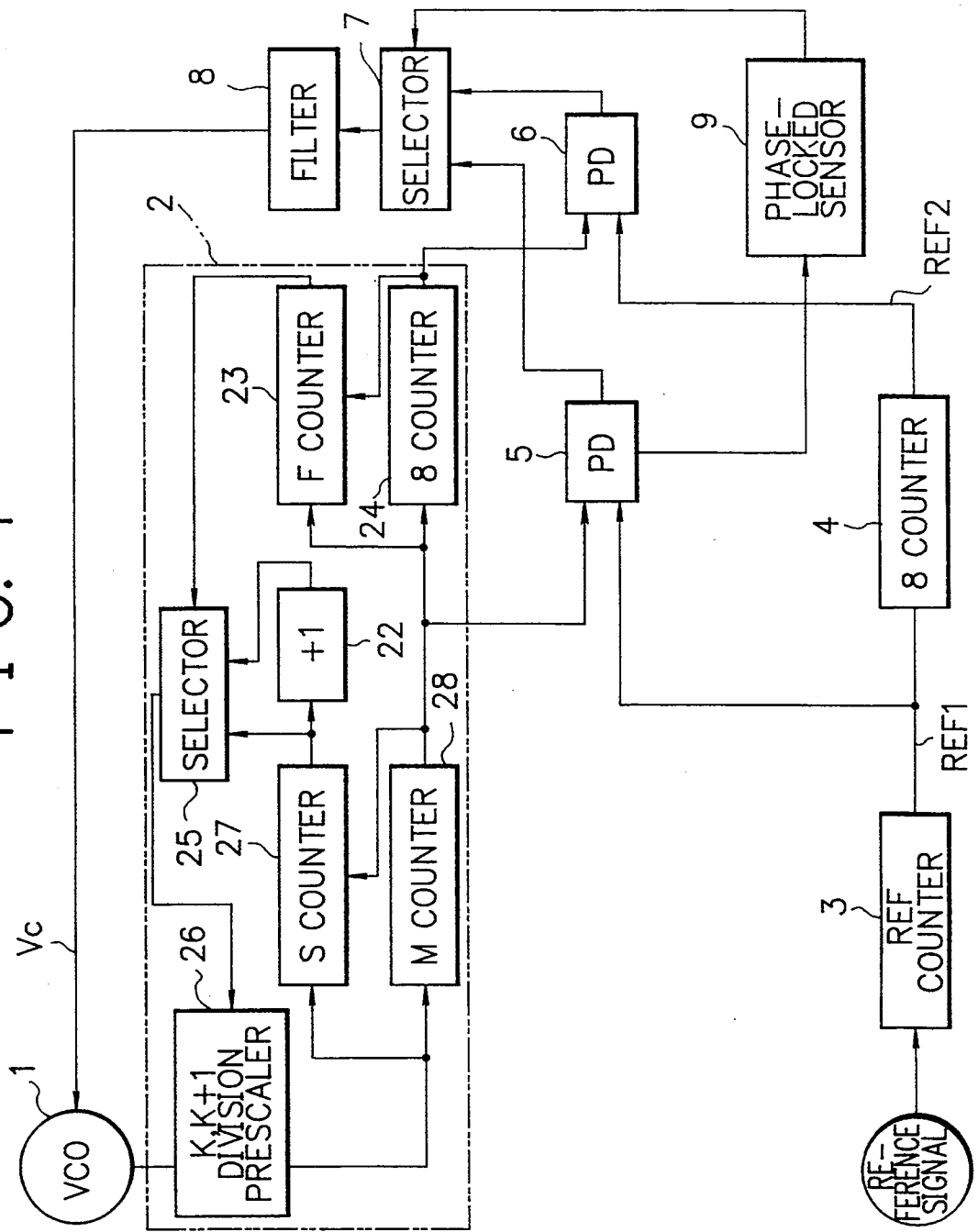
FIG. 4 is a circuit block diagram illustratively showing a second embodiment of the PLL frequency synthesizer in accordance with the present invention.

FIG. 4 shows in a block diagram the circuit configuration of a second embodiment of the PLL frequency synthesizer in accordance with the present invention. This embodiment includes, in place of the A counter 21 of FIG. 2, a pulse swallow divider including a dual modulus prescaler 26 for K and K+1 divisions, a swallow (S) counter 27, and a main (M) counter 28.

In the pulse swallow divider, as shown in FIG. 5, the total dividing number A related to inputs and outputs thereof is expressed as follows.

$$\begin{aligned} A &= K \cdot M + S \\ &= K \cdot M - K \cdot S + K \cdot S + S \\ &= K \cdot (M - S) + (K + 1) \cdot S \end{aligned} \quad (2)$$

Consequently, in the M count operation of the S counter 27, the dual modulus prescaler 26 is set to the K+1 division until the S count operation is finished, and then the prescaler 26 is set to the K division for the remaining (M−S) count operation. Thanks to the selective division numbers, there is obtained the dividing number A. In this case, K−1, 2, etc., M=2, 3, etc., and S=1, 2, ..., M−1, i.e., M>S. That is, the overall circuit structure including the prescaler 26, the S counter 27, and the M counter 28 of FIG. 5 functions as the A counter 21 of FIG. 2. Therefore, like in the case of FIG. 2, when a +1 counter 22 is connected to the output port of the S counter 27, the +1 counter 22 produces an output represented as $KM+S+A=A+1$.

Namely, there is constructed a counter for an (A+1) count operation. As a result, using the selector in FIG. 4, there can be effected a change-over operation between the counter (26, 27, 28) for the A count operation and the counter (26, 27, 28, 22) for the (A+1) count operation. Operation of the circuit of FIG. 4 becomes substantially equal to that of FIG. 2.

The embodiments above are suitable examples of embodying the present invention, however, the present invention is not restricted by the embodiments. These embodiments can be changed or modified without departing from the scope and spirit of the present invention. For example, in the description above, although the resolution ⅛ is assumed by way of example of the fractional division, the resolution may be arbitrarily set to ¼, 1/16, or 1/R. In this case, there will be adopted a four counter, a 16 counter, or an R counter in place of the 8 counter, respectively. In addition, assuming R=2n, the setting data can be handled such that n low-order bits of the binary data thereof and the remaining high-order bits need only be set as values of the F and A counters, respectively. The setting data algorithm becomes effectively equal to that of the prior art without bearing the fractional division in mind.

Furthermore, in the fractional divider 2, the 8 counter 24 is related to generation of both of the division signal S1 having a high frequency and the division signal 32 having a low frequency. However, depending on the value of the counter 4, there may be provided a counter to exclusively generate the division signal S2.

As can be clear from the above description, in the primary portions of the PLL frequency synthesizer and the PLL frequency synthesizing method in accordance with the present invention, the reference signal is divided to attain the first and second reference signals so as to achieve a phase comparison therebetween to obtain the first and second comparison signals. According to these comparison signals, the phase of the oscillation signal is supervised to create an oscillation signal related to the reference signal. For this purpose, the PLL frequency synthesizer in accordance with the present invention divides the oscillation frequency of the oscillation signal by a fractional division number to generate a first division signal having a frequency almost equal to that of the first reference signal. Thereafter, the synthesizer divides the first division signal by a predetermined division number to produce a second division signal. According to the comparison signals obtained through comparison between the reference signals and the division signals, the phase of the oscillation signal is controlled.

As a result, in the first stage, the phase of the oscillation frequency is controlled by the comparison signal between the high-frequency first division signal obtained by the fractional division and the first reference signal. When the phase difference between the first division signal and the first reference signal becomes almost zero in the first stage, there is achieved the comparison control between the low-frequency second division signal and the second reference signal in the second stage. The first division signal obtained for the first-stage control operation is a signal obtained by a fractional division. Consequently, the phase difference between the first division signal and the reference signal is substantially suppressed, thereby conducting a high-precision control operation.

After the high-speed and high-precision control operation is thus accomplished in the first stage, the processing proceeds to the highly stable low-frequency control operation in the second stage. Thanks to supervision of these procedures, it is possible to control the oscillation frequency at a high speed in a stable state.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A PLL frequency synthesizer in which a phase comparison is conducted between a reference signal and an oscillation signal to control a phase of the oscillation signal so as to produce an oscillation signal related to the reference signal, comprising:

reference signal dividing means for generating a first reference signal by dividing the reference signal and for generating a second reference signal by dividing the first reference signal by a predetermined division number;

fractional dividing means for dividing the oscillation frequency of the oscillation signal by a fractional division number and thereby producing a first division signal having a frequency substantially equal to that of the first reference signal and for producing a second division signal by dividing the first division signal by the predetermined division number;

first comparing means for comparing the first reference signal with the first division signal and thereby producing a first comparison signal;

second comparing means for comparing the second reference signal with the second division signal and thereby producing a second comparison signal; and selecting means for selecting according to a state of the first comparison signal either one of the first and second comparison signals, thereby controlling the phase of the oscillation signal according to the comparison signal created from the selecting means.

2. A PLL frequency synthesizer as claimed in claim 1, further comprising phase lock sensing means, the phase lock sensing means sensing substantial presence and absence of the first comparison signal and outputting a sense signal thereof to the selecting means, the selecting means selecting the first or second comparison signal respectively when the first or second comparison signal is present and thereby outputting the selected signal.

3. A PLL frequency synthesizer as claimed in claim 1, further comprising filter means, the filter means smoothing the comparison signal produced from the selecting means.

4. A PLL frequency synthesizer as claimed in claim 1, wherein the comparing and (fractional) dividing means includes A count means for dividing the oscillation signal by A, (A+1) count means for dividing the oscillation signal by (A+1), F count means for counting cycles of a repetitious count operation in M cycles, and M count means for counting repetitions (A, F, and M are integers), the fractional division number N being obtained through count operations of the respective count means according to a relational expression $$N = A \cdot (M-F) + (A+1) \cdot F$$

where, A and F are respectively a quotient and a remainder obtained by dividing N by M.

5. A PLL frequency synthesizer as claimed in claim 4, wherein the A count means includes dual modulus count means for achieving a change-over between a K division and a K+1 division, S count means for conducting an S count operation, and second M count means (K, S, and M are integers), the A division being obtained through count operations of the respective count means according to a relational expression $$A = K \cdot (M-S) + (K+1) \cdot S.$$

6. A PLL frequency synthesizing method in which a phase comparison is conducted between a reference signal and an oscillation signal to control a phase of the oscillation signal so as to produce an oscillation signal related to the reference signal, comprising:

a reference signal dividing step of generating a first reference signal by dividing the reference signal and for generating a second reference signal by dividing the first reference signal by a predetermined division number;

a fractional dividing step of dividing the oscillation frequency of the oscillation signal by a fractional division number and thereby producing a first division signal having a frequency substantially equal to that of the first reference signal and for producing a second division signal by dividing the first division signal by the predetermined division number;

a first comparing step of comparing the first reference signal with the first division signal and thereby producing a first comparison signal;

a second comparing step of comparing the second reference signal with the second division signal and thereby producing a second comparison signal; and a selecting step of selecting according to a state of the first comparison signal either one of the first and second comparison signals, thereby controlling the phase of the oscillation signal according to the comparison signal created from the selecting means.

7. A PLL frequency synthesizing method as claimed in claim 6, further comprising a phase lock sensing step, the phase lock sensing step sensing substantial presence and absence of the first comparison signal and outputting a sense signal thereof to the selecting step, the selecting step selecting the first or second comparison signal respectively when the first or second comparison signal is present and thereby outputting the selected signal.

8. A PLL frequency synthesizing method as claimed in claim 6, wherein the fractional dividing step includes an A count step for dividing the oscillation signal by A, an (A+1) count step for dividing the oscillation signal by (A+1), an F count step for counting cycles of a repetitious count operation in M cycles, and an M count step for counting repetitions (A, F, and M are integers), the fractional division number N being obtained through count operations of the respective count steps according to a relational expression $$N = A.(M-F) + (A+1).F$$

where, A and F are a quotient and a remainder attained by dividing N by M.

9. A PLL frequency synthesizing method as claimed in claim 8, wherein the A count step includes a dual modulus count step of achieving a change-over operation between a K division and a K+1 division, an S count step of conducting an S count operation, and a second M count step (K, S, and M are integers), the A division being obtained through count operations of the respective count steps according to a relational expression $$A = K.(M-S) + (K+1).S.$$

* * * * *